(12) United States Patent
Tseng et al.

(10) Patent No.: US 10,614,935 B1
(45) Date of Patent: Apr. 7, 2020

(54) PTC DEVICE

(71) Applicant: Polytronics Technology Corp., Hsinchu (TW)

(72) Inventors: Chun Teng Tseng, Sanwan Township, Miaoli County (TW); David Shau Chew Wang, Taipei (TW); Wen Feng Lee, Taoyuan (TW)

(73) Assignee: POLYTRONICS TECHNOLOGY CORP., Hsinchu (TW)

( * ) Notice: Subject to any disclaimer, the term of this patent is extended or adjusted under 35 U.S.C. 154(b) by 0 days.

(21) Appl. No.: 16/290,243

(22) Filed: Mar. 1, 2019

(30) Foreign Application Priority Data

Sep. 27, 2018 (TW) .............................. 107134108 A (51) Int. Cl.
*H01C 7/02* (2006.01)
*H01C 1/14* (2006.01)
*G01R 19/00* (2006.01)
*G01K 7/22* (2006.01)
*H01C 17/00* (2006.01)

(52) U.S. Cl.
CPC .............. *H01C 7/021* (2013.01); *G01K 7/22* (2013.01); *G01R 19/0092* (2013.01); *H01C 1/1406* (2013.01); *H01C 17/00* (2013.01)

(58) Field of Classification Search
CPC ........... H01C 7/021; H01C 17/00; G01K 7/22
USPC ...................................................... 338/22 R
See application file for complete search history.

(56) References Cited

U.S. PATENT DOCUMENTS

| 6,377,467 | B1 | 4/2002 | Chu et al. | |
|---|---|---|---|---|
| 9,007,166 | B2 | 4/2015 | Tseng et al. | |
| 2014/0146432 | A1* | 5/2014 | Wang | H01C 7/021 361/93.7 |
| 2015/0124366 | A1* | 5/2015 | Tseng | H02H 9/026 361/118 |

FOREIGN PATENT DOCUMENTS

| CN | 1714413 A | 12/2005 |
|---|---|---|
| CN | 206401113 U | 8/2017 |
| TW | 583080 B | 4/2004 |

* cited by examiner

*Primary Examiner* — Kyung S Lee
*Assistant Examiner* — Iman Malakooti
(74) *Attorney, Agent, or Firm* — Muncy, Geissler, Olds & Lowe, P.C.

(57) ABSTRACT

A PTC device comprises a current and temperature sensing element, a first insulating layer, a second insulating layer, a first electrode layer and a second electrode layer. The current and temperature sensing device is a laminated structure comprising a first conductive layer, a second conductive layer and a PTC material layer. The first and second conductive layers are disposed on first and second surfaces of the PTC material layer, respectively. The second surface is opposite to the first surface. The first and second insulating layers are disposed on the first and second conductive layers, respectively. The first electrode layer is disposed on the first insulating layer and electrically connects to the first conductive layer. The second electrode layer is disposed on the second insulating layer and electrically connects to the second conductive layer. Corners of the current and temperature sensing device are provided with insulating members.

10 Claims, 6 Drawing Sheets

PTC DEVICE

BACKGROUND OF THE INVENTION

(1) Field of the Invention

The present application relates to a thermistor. More specifically, it relates to a positive coefficient temperature (PTC) device.

(2) Description of the Related Art

A PTC device can be used for circuit protection to avoid over-temperature or over-current which would cause damages. A PTC device usually comprise two electrodes and a resistive material disposed therebetween. The resistive material has PTC feature, i.e., it has an low resistance at a normal temperature; however, when an over-current or an over-temperature occurs in the circuit, the resistance instantaneously increases to extremely high resistance (i.e., trip) to diminish the current for circuit protection. The PTC device can be applied to temperature sensing circuit to sense ambient temperature, so as to determine on whether to take actions for over-temperature protection such as shutdown or power off. When the temperature decreases to room temperature or over-current no longer exists, the over-current protection device returns to low resistance state so that the circuit operates normally again. Because the PTC devices can be reused, they can replace fuses or other temperature sensing devices to be widely applied to high-density circuitries.

With lightweight and compact trends, electronic apparatuses are getting smaller. For a cell phone, a number of components have to be integrated into a limited space, in which an over-current protection device is usually secured to a protective circuit module (PCM) and its external lead will occupy a certain space. Therefore, it is desirable to have a thin-type protection device that does not take up much room. When the device is downsizing to form factor 0201, it is a great challenge on how to decrease the thickness of the protection device for surface-mount applications.

According to specification of 0201, a device has a length of 0.6±0.03 mm, a width of 0.3±0.03 mm and a thickness of 0.25±0.03 mm. In manufacturing, the length and width are doable, but the thickness is too thin to be achieved. Nowadays, the resistive material substrate of carbon black system can be at most pressed to 0.2 mm in thickness, and the resistive material substrate of ceramic filler system can obtain a thickness of 0.2-0.23 mm. If the resistive substrate is further engaged with insulating (prepreg) layers and internal and external circuits (electrodes) to form an over-current protection device as shown in U.S. Pat. No. 6,377,467, not only is the thickness out of specification but also the thickness may be equal to or larger than width. As a result, the devices may topple when they are subjected to packaging or other processes afterwards. Moreover, the internal-and-external circuit design on a small size device sometimes has misalignment between the internal circuit and external circuit, and therefore the production yield will be negatively impacted.

U.S. Pat. No. 9,007,166 proposes a solution to the aforesaid problem. Without prepreg layers and external electrode layers, a PTC composite substrate is devised to etch or cut an electrode layer of the PTC composite substrate to form a groove isolating right and left electrodes, so as to control the thickness of the PTC over-current protection device to be smaller than or equal to 0.28 mm. However, the electrode layers of the PTC device are not symmetrical, and therefore there is a need to verify the orientation of the PTC device under electric testing and packaging. Moreover, the groove may be misaligned due to inflation and retraction of the PTC material during manufacturing, and the right and left electrodes of unequal areas influence electric characteristics. Without support of prepreg layers, the PTC device may flaw due to insufficient strength during manufacturing. Moreover, the PTC material may be molten caused by high temperature during cutting. During a first cut, e.g., along X-axis, the molten material is moved away by a cutter, burr or flash is not a serious problem. However, during a sequential second cut, e.g., along Y-axis, molten material residue may exist in the groove of the first cut to incur burr or flash. The burr problem is less serious for devices of large sizes and becomes more serious for devices of small sizes. The burr incurs rough surfaces and uncontrollable dimensions of the device and therefore impacts sequential processes including tape and reel, surface mounting and soldering.

In view of the above, for downsizing PTC devices, it is a great challenge to diminish burr or flash after cutting to avoid the sequential tape and reel, SMT mounting and soldering processes.

SUMMARY OF THE INVENTION

The present application provides a PTC device characterized in over-current protection and/or over-temperature sensing. The PTC device in which a current and temperature sensing element is provided with insulating members at corners connecting to adjacent lateral surfaces is devised to increase structural strength, avoid burr or flash, and improve manufacturing yield.

In accordance with an embodiment of the present application, a PTC device comprises a current and temperature sensing element, a first insulating layer, a second insulating layer, a first electrode layer and a second electrode layer. The current and temperature sensing element is a laminated structure of a first electrically conductive layer, a second electrically conductive layer and a PTC material layer. The first electrically conductive layer is disposed on a first surface of the PTC material layer, and the second electrically conductive layer is disposed on a second surface of the PTC material layer. The second surface is opposite to the first surface. The first insulating layer is disposed on the first electrically conductive layer, and the second insulating layer is disposed on the second electrically conductive layer. The first electrode layer is disposed on the first insulating layer and electrically connects to the first electrically conductive layer. The second electrode layer is disposed on the second insulating layer and electrically connects to the second electrically conductive layer. Corners of the current and temperature sensing element are provided with insulating members.

In an embodiment, the insulating member extends over a laminate of the first electrically conductive layer, the PTC material layer and the second electrically conductive layer.

In an embodiment, the first and second electrode layers serve as solder attach surfaces for soldering the PTC device onto a circuit board.

In an embodiment, the insulating member comprises prepreg or resin.

In an embodiment, the insulating member has a hardness larger than that of the PTC material layer.

In an embodiment, the insulating layer has a glass transition temperature (Tg) higher than that of the PTC material layer by at least 50° C.

In an embodiment, the first electrode layer, the first insulating layer, the first electrically conductive layer, the PTC material layer, the second electrically conductive layer, the second insulating layer and the second electrode layer are laminated in order.

In an embodiment, the first electrode layer, the first insulating layer, the first electrically conductive layer, the PTC material layer, the second electrically conductive layer, the second insulating layer and the second electrode layer form a bottom surface facing the circuit board as an interface for soldering onto the circuit board.

In an embodiment, the PTC device further comprises a first electrically conductive hole and a second electrically conductive hole. The first electrically conductive hole penetrates through the first insulating layer and connects to the first electrode layer and the first electrically conductive layer. The second electrically conductive hole penetrates through the second insulating layer and connects to the second electrode layer and the second electrically conductive layer.

In an embodiment, the first electrically conductive hole is located at a center or a lateral surface of the first insulating layer, and the second electrically conductive hole is located at a center or a lateral surface of the second insulating layer.

In an embodiment, the first insulating layer, the first electrically conductive layer, the PTC material layer, the second electrically conductive layer and the second insulating layer form a bottom surface facing the circuit board. The first electrode layer retracts at edges relative to the first insulating layer to form notches, and the second electrode layer retracts at edges relative to the second insulating layer to form notches.

In an embodiment, the first electrode layer comprises a bulge extending to an edge of the first insulating layer, and the second electrode layer comprises another bulge extending to an edge of the second insulating layer.

In a printed circuit board (PCB) process, the substrate for making the current and temperature sensing element is drilled to form holes. The holes are filled with resin or prepreg in a sequential press process to form insulating members. The insulating members are formed at the corners of the current and temperature sensing element to avoid or diminish burrs after cutting, and thereby improving tape, reel and soldering processes.

In the present application, the PTC device in which the first electrode layer and the second electrode layer at two ends of the laminate serve as solder attach surfaces for soldering onto a circuit board is suitable to be made in small sizes.

BRIEF DESCRIPTION OF THE DRAWINGS

The present application will be described according to the appended drawings in which.

DETAILED DESCRIPTION OF THE INVENTION

The making and using of the presently preferred illustrative embodiments are discussed in detail below. It should be appreciated, however, that the present application provides many applicable inventive concepts that can be embodied in a wide variety of specific contexts. The specific illustrative embodiments discussed are merely illustrative of specific ways to make and use the invention, and do not limit the scope of the invention.

Figure 1:
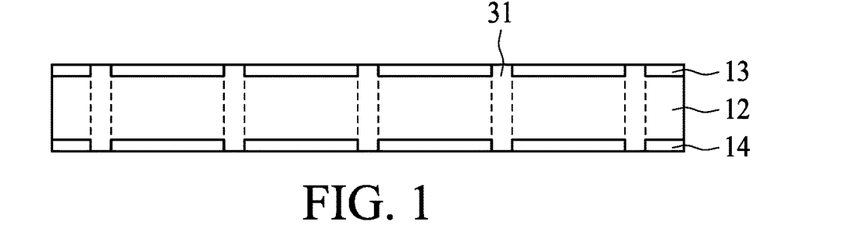
FIGS. 1 through 5 show a manufacturing process of a PTC device in accordance with an embodiment of the present application.
Figure 2:
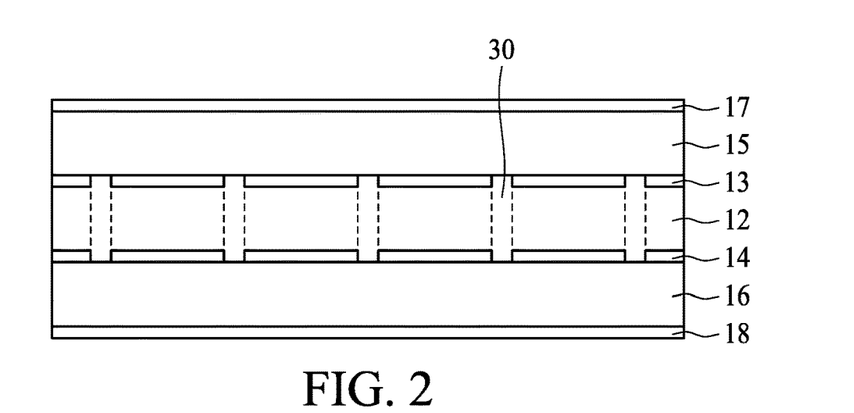

Referring to FIG. 1, a composite substrate including a first electrically conductive layer 13, a PTC material layer 12 and a second conductive layer 14 is provided and the composite substrate is drilled to form holes 31 with certain intervals therebetween. Referring to FIG. 2, a first electrode layer 17, a first insulating layer 15, the first electrically conductive layer 13, the PTC material layer 12, the second electrically conductive layer 14, a second insulating layer 16 and a second electrode layer 18 are pressed to form a laminated structure. The first electrically conductive layer 13 is disposed on a first surface of a PTC material layer 12, and the second electrically conductive layer 14 is disposed on a second surface of the PTC material layer 12. The second surface is opposite to the first surface. The first insulating layer 15 is disposed on the first electrically conductive layer 13, and the second insulating layer 16 is disposed on the second electrically conductive layer 14. The first electrode layer 17 is disposed on the first insulating layer 15, and the second electrode layer 18 is disposed on the second insulating layer 16. The first and second electrically conductive layers 13 and 14 may be copper layers. The first and second insulating layers 15 and 16 may comprise prepreg. The first and second electrode layers 17 and 18 may comprise copper. Prepreg is flowable and therefore can be filled in the holes 31 during pressing to form insulating members 30. Alternatively, the holes 31 can be filled with material such as resin before pressing to form the insulating members 30. The material of the insulating members 30 is not limited to prepreg or resin, other polymers with required features such as insulation and hardness can be used instead.

The PTC material layer 12 comprises crystalline polymer and conductive filler dispersed therein. The crystalline polymer comprises polyethylene, polypropylene, polyvinyl fluoride, mixture or copolymer thereof. The conductive filler may comprise carbon-containing filler, metal filler, and/or ceramic filler. For example, the metal filler may be nickel, cobalt, copper, iron, tin, lead, silver, gold, platinum, or the alloy thereof. The ceramic filler may be titanium carbide (TiC), tungsten carbide (WC), vanadium carbide (VC), zirconium carbide (ZrC), niobium carbide (NbC), tantalum carbide (TaC), molybdenum carbide (MoC), hafnium carbide (HfC), titanium boride (TiB$_2$), vanadium boride (VB$_2$), zirconium boride (ZrB$_2$), niobium boride (NbB$_2$), molybdenum boride (MoB$_2$), hafnium boride (HfB$_2$), or zirconium nitride (ZrN). Moreover, the conductive filler may be the mixture, alloy, solid solution or core-shell of the aforesaid metal and ceramic fillers.

Figure 3:
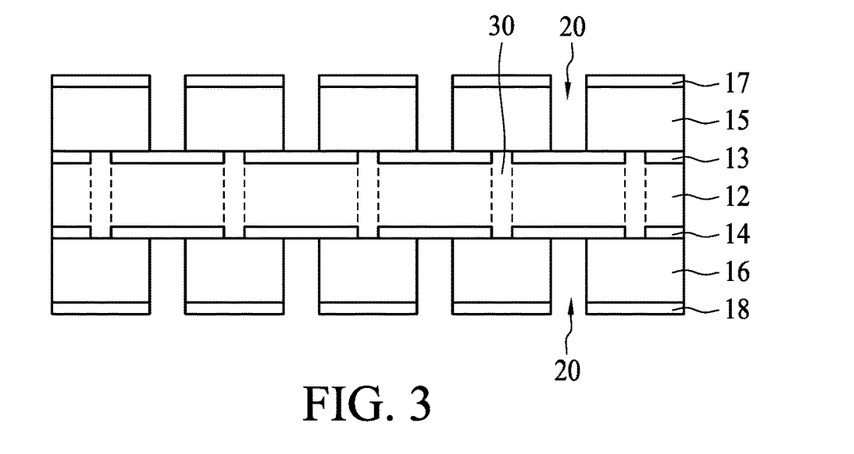
Figure 4:
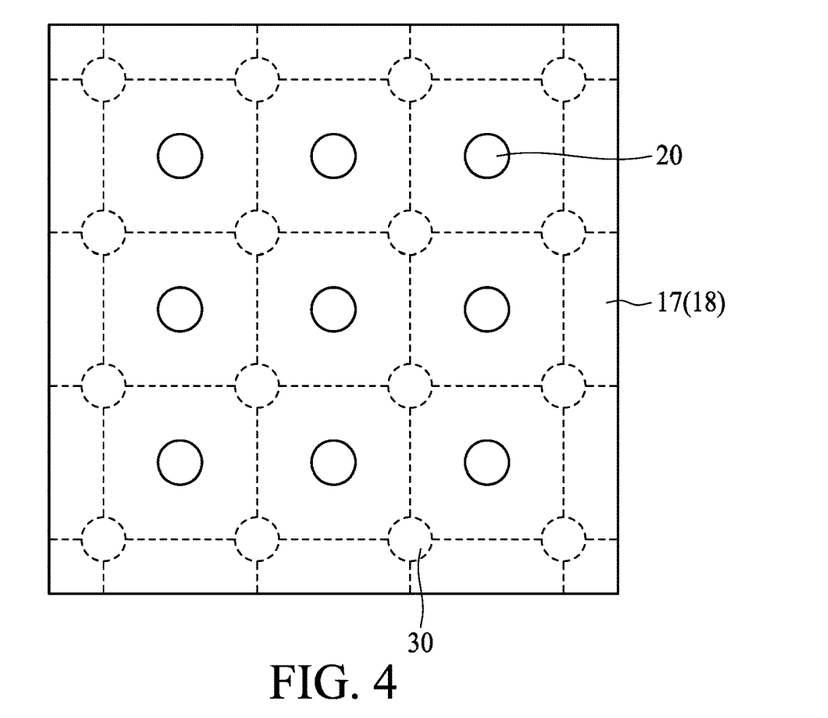

Referring to FIGS. 3 and 4, FIG. 3 is a side view of the laminated structure and FIG. 4 is a top view thereof. Holes 20 with certain intervals are made in the laminated substrate. As shown in FIG. 4, the hole 20 is located among adjacent four insulating members 30. Vertical and horizontal dashed lines are predetermined cutting lines and the insulating members 30 are located at intersections of the vertical and horizontal cutting lines. Upper holes 20 go through the first electrode layer 17 and the first insulating layer 15 and stop at the first electrically conductive layer 13. Lower holes 20 go through the second electrode layer 18 and the second insulating layer 16 and stop at the second electrically conductive layer 14. The holes 20 may be directly made by laser drilling which is suitable for small size holes and can control the drilling depth precisely. Alternatively, the first electrode layer 17 and the second electrode layer 18 can be etched first and followed by laser drilling the first insulating layer 15 and the second insulating layer 16. The holes 20 may be made by mechanical drilling. However, the first electrically conductive layer 13 and the second electrically conductive layer 14 may be partially and fully removed by mechanical drilling.

Figure 5:
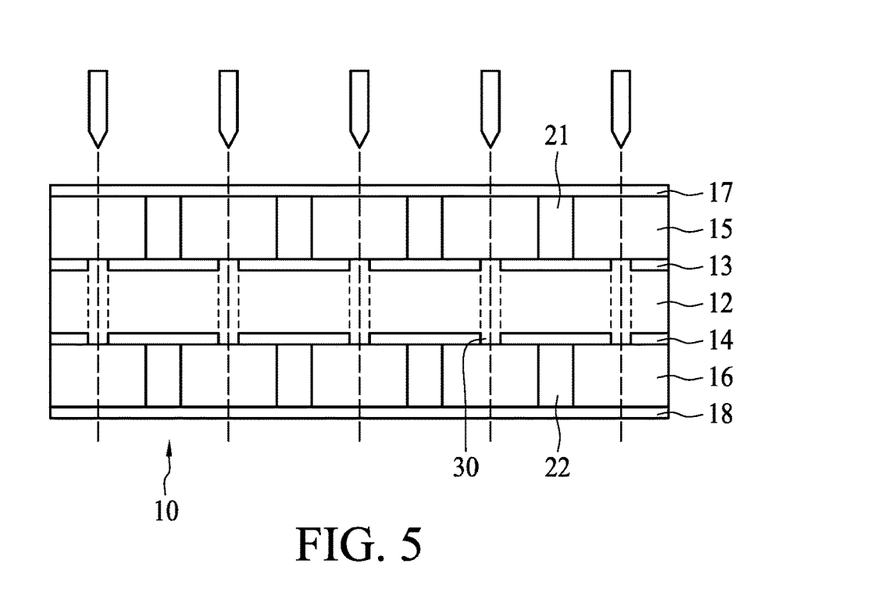
Figure 6:
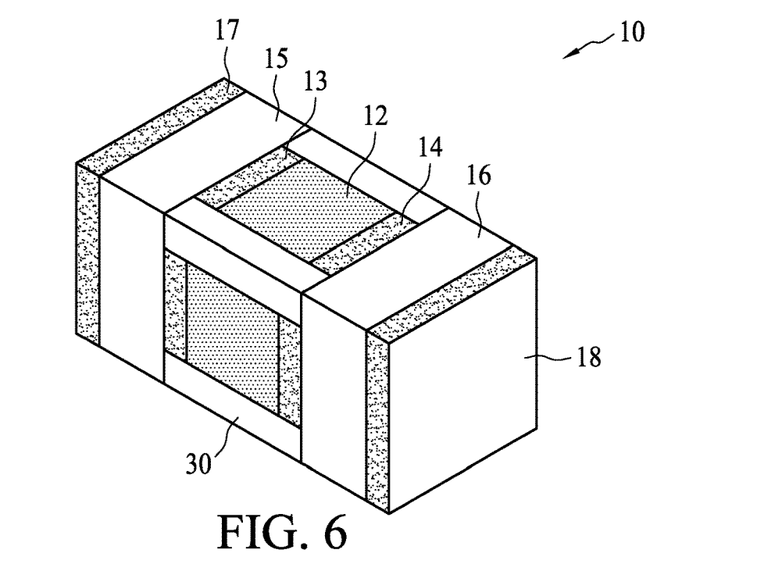
FIG. 6 shows a PTC device in accordance with an embodiment of the present application.

Referring to FIG. 5, the upper and lower holes 20 are filled with electrically conductive material to form first electrically conductive members 21 and second electrically conductive members 22. In an embodiment, the first and second electrically conductive members 21 and 22 may be made by electroplating copper. During electroplating, copper may be electroplated onto the first electrode layer 17 and the second electrode layer 18 also to increase their thicknesses. In case of large holes 20, the material of the first and second electrically conductive members 21 and 22 may be not able to fully fill the holes 20. As a result, recesses may be generated on the surfaces of the conductive members 21 and 22. The first and second electrode layers 17 and 18 may be plated with tin to enhance solderability. Afterwards, the laminated structure is divided along the cutting lines to form a plurality of PTC devices 10. A single PTC device 10 is shown in FIG. 6. In an embodiment, the PTC device 10 has equal width and thickness, that is, as shown in FIG. 6, the first electrode layers 17 and 18 are square. As such, the PTC device 10 is not affected even if it rolls over. It should be noted that the first and second electrode layers 17 and 18 are not limited to square and may be rectangular. The insulating members 30 are formed at corners of the middle of the PTC device 10. The material of the insulating members 30 such as prepreg or resin is tougher than the PTC material layer 12 and, unlike the first electrically conductive layer and the second electrically conductive layer, it has no metal ductility. Therefore, the insulating members 30 can protect the PTC material and avoid occurrence of burr or flash. To prevent the PTC material layer 12 from generating burr or flash, a hardness of the insulating member 30 is larger than that of the PTC material layer 12 or a glass transition temperature (Tg) of the insulating member 30 is higher than that of the PTC material layer 12 by at least 50° C.

Figure 7:
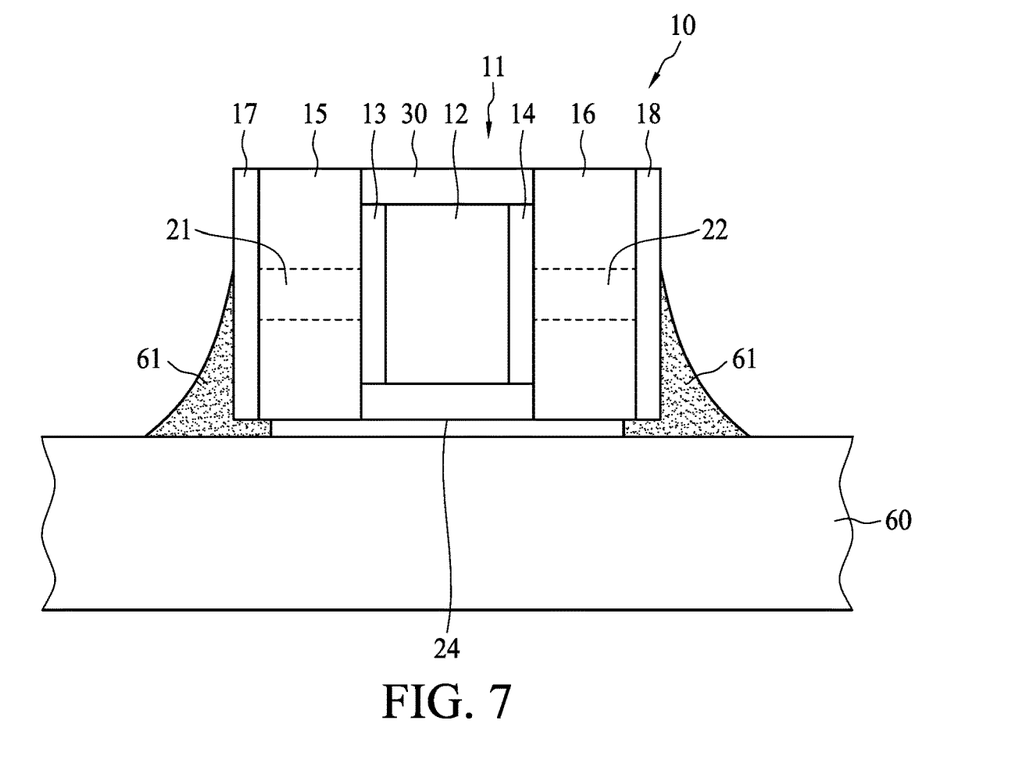
FIG. 7 shows a cross-sectional view of a PTC device applied to a circuit board in accordance with an embodiment of the present application.

FIG. 7 shows the PTC device 10 soldered onto a circuit board 60 in accordance with an embodiment of the present application. The PTC device 10 is soldered onto the circuit board 60 through solder paste 61. The PTC device 10 comprises a current and temperature sensing element 11, the first insulating layer 15, the second insulating layer 16, the first electrode layer 17, the second electrode layer 18, the first electrically conductive member 21 and the second electrically conductive member 22. The current and temperature sensing element 11 is a laminate comprising a first electrically conductive layer 13, a second electrically conductive layer 14 and a PTC material layer 12 laminated therebetween. The insulating members 30 extend over the laminate of the first electrically conductive layer 13, the second electrically conductive layer 14 and the PTC material layer 12. More specifically, four insulating members 30 are formed at corners of the current and temperature sensing element 11. Each corner connects adjacent lateral surfaces of the current and temperature sensing element 11. The first electrode layer 17 is disposed on the first insulating layer 15, and electrically connects to the first electrically conductive layer 13. The second electrode layer 18 is disposed on the second insulating layer 16, and electrically connects to the second electrically conductive layer 14. The first electrically conductive member 21 penetrates through the first insulating layer 15 and connects to the first electrode layer 17 and the first electrically conductive layer 13. The second electrically conductive member 22 penetrates through the second insulating layer 16 and connects to the second electrode layer 18 and the second electrically conductive layer 14. In this embodiment, the first electrode layer 17, the first insulating layer 15, the first electrically conductive layer 13, the PTC material layer 12, the second electrically conductive layer 14, the second insulating layer 16 and the second electrode layer 18 are stacked in order and form a bottom surface 24. The bottom surface 24 faces the circuit board 60 as an interface for soldering onto the circuit board 60. During soldering, solder paste 61 climbs up along the first electrode layer 17 and the second electrode layer 18. In other words, the first electrode layer 17 and the second electrode layer 18 serve as solder attach surfaces when soldering the PTC device 10 onto the circuit board 60.

Figure 8:
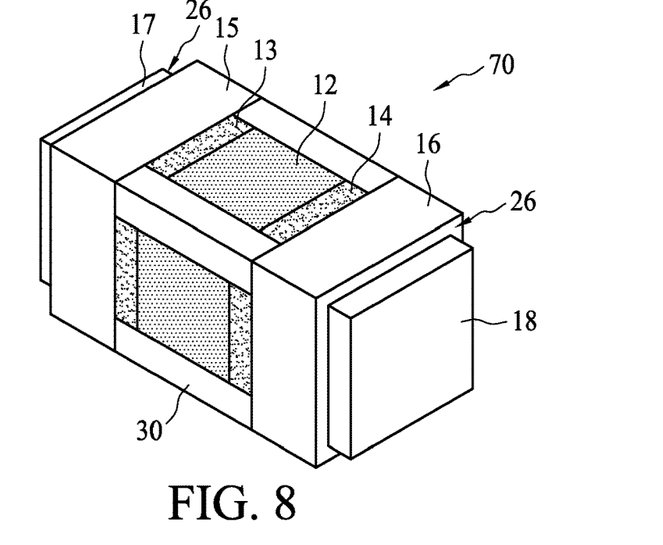
FIG. 8 shows a PTC device in accordance with another embodiment of the present application.
Figure 9:
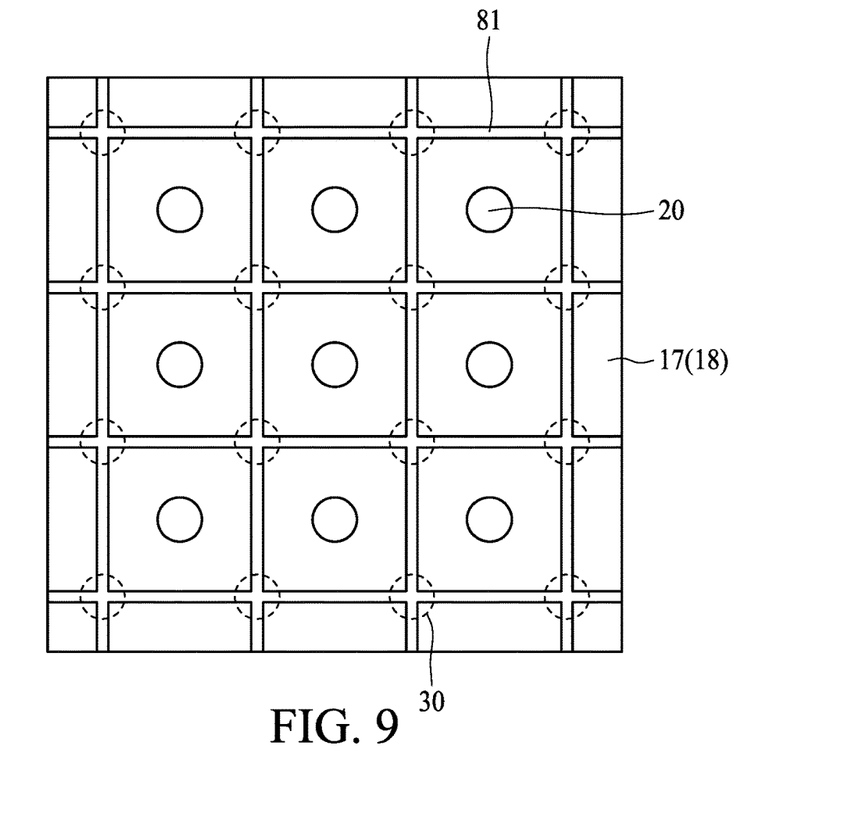
FIG. 9 shows a way of making a PTC device in accordance with an embodiment of the present application.

When cutting to form the PTC devices 10, as shown in FIG. 5, the bottom second electrode layer 18 may be stretched by the cutter to cause burrs because of metal ductility. FIG. 8 shows a PTC device 70 in accordance with another embodiment of the present application. In comparison with the PTC device 10 shown in FIG. 6, The first electrode layer 17 retracts at edges relative to the first insulating layer 15 to form notches 26, and the second electrode layer 18 retracts at edges relative to the second insulating layer 16 to form notches 26 as well. In this embodiment, the PTC device 70 is symmetrical. FIG. 9 shows a way of making the first and second electrode layers 17 and 18 of the PTC device 70. Before cutting, grooves 81 are made in the first and second electrode layers 17 and 18. The grooves 81 surround the holes 20 and locate at cutting positions. The intersections of vertical and horizontal grooves 81 correspond to the positions of the insulating members 30. The width of the groove 81 is larger than cutting width and is approximately the width of a cutter plus twice the width of the notch 26. As a result, the cutter does not touch the first and second electrode layers 17 and 18 when cutting to form the notches 26, so as to avoid burrs on the electrode layer 17 or 18.

Figure 10:
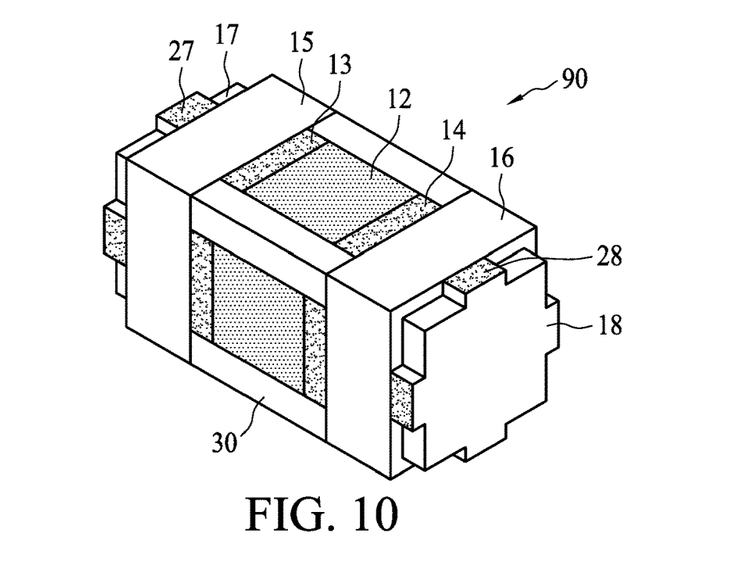
FIG. 10 shows a PTC device in accordance with yet another embodiment of the present application.
Figure 11:
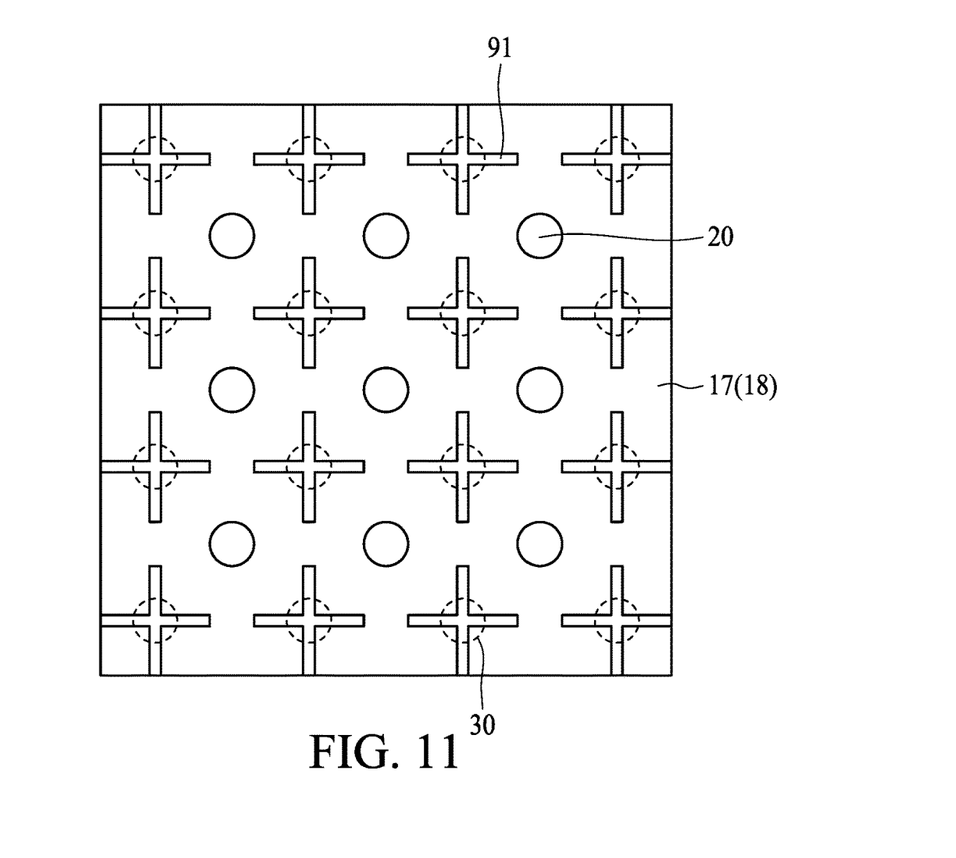
FIG. 11 shows a way of making a PTC device in accordance with another embodiment of the present application.

FIG. 10 shows a PTC device 90 in accordance with yet another embodiment of the present application. The first and second electrode layers 17 and 18 of both the PTC device 90 and the PTC device 70 retract their edges. Different from the PTC device 70, the edges of the first electrode layer 17 of the PTC device 90 comprise bulges 27 extending to the edges of the first insulating layer 15, and the edges of the second electrode layer 18 of the PTC device 90 comprise bulges 28 extending to the edges of the second insulating layer 16. One of the bulges 27 and one of the bulges 28 reach the bottom of the PTC device 90 to provide paths for solder attachment or solder climbing. As such, it is advantageous to enhance solder attachment especially for large notches 26. FIG. 11 shows a way of making the first and second electrode layers 17 and 18 of the PTC device 90. Grooves 91 are made in the first and second electrode layers 17 and 18. The grooves 91 correspond to cutting positions but are not continuous. The first and second electrode layers 17 and 18 of neighboring devices 90 are partially connected. The connection of the first and second electrode layers 17 and 18 form the bulges 27 and 28. In an embodiment, the width of the bulge 27 or 28 is 20-60% of the width of the first or second insulating layer 15 or 16. The width of the groove 91 is larger than cutting width, and is approximately equal to the width of a cutter plus twice the width of the notch 26. Because the bulges 27 and 28 are relatively small in comparison with the first and second electrode layers 17 and 18, the burr issue can be diminished when cutting the bulges 27 and 28 and solder attachment becomes more effective.

The electrically conductive member 21 or 22 may be located at but not limited to the center of the insulating layer 15 or 16. Alternatively, the electrically conductive members 21 and 22 may be located at center portions of lateral surfaces of the device as long as they can electrically connect the first electrically conductive layer 13 and the first electrode layer 17 and electrically connect the second electrically conductive layer 14 and the second electrode layer 18. In the above embodiments, the insulating layers 30 of prepreg or resin increase structural strength to be suitable for device miniaturization.

Figure 12:
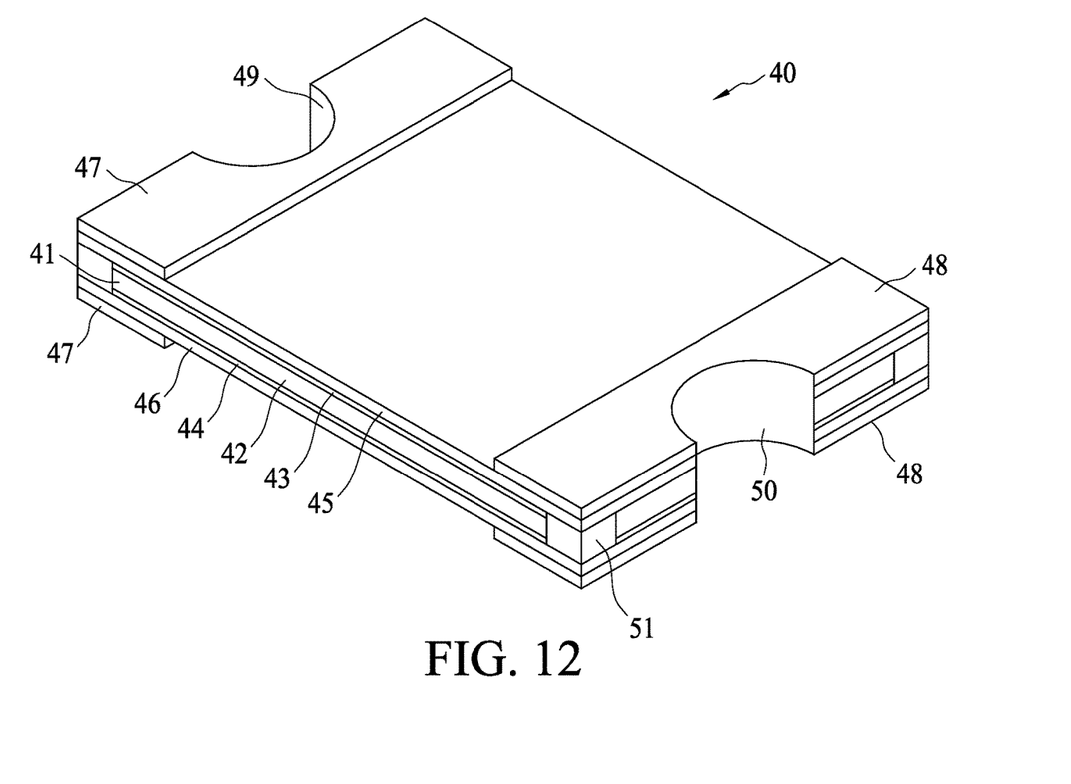
FIG. 12 shows a PTC device in accordance with an embodiment of the present application.

FIG. 12 shows a PTC device of the present application, which is similar to the device disclosed in U.S. Pat. No. 6,377,467 except insulating members are formed at corners of the device to reduce burrs. A PTC device 40 comprises a current and temperature sensing element 41, a first insulating layer 45, a second insulating layer 46, a first electrode layer 47 and a second electrode layer 48. The current and temperature sensing element 41 is a laminated structure comprising a first electrically conductive layer 43, a second electrically conductive layer 44 and a PTC material layer 42. The first electrically conductive layer 43 is disposed on a first surface of the PTC material layer 42. The second electrically conductive layer 44 is disposed on a second surface of the PTC material layer 42. The second surface is opposite to the first surface. The first insulating layer 45 is disposed on the first electrically conductive layer 43, and the second insulating layer 46 is disposed on the second electrically conductive layer 44. The first electrode layer 47 has two sections disposed on the first insulating layer 45 and the second insulating layer 46, respectively, and electrically connects to the first electrically conductive layer 43 through a conductive hole 49. The second electrode layer 48 has two sections disposed on the first insulating layer 45 and the second insulating layer 46, respectively, and electrically connects to the second electrically conductive layer 44 through a conductive hole 50. Insulating members 51 are formed at four corners of the current and temperature sensing element 41 of the PTC device 40. The material of the insulating members 51 such as prepreg or resin is tougher than the PTC material layer 42 and do not have metal ductility which is inherent in the first electrically conductive layer 43 and the second electrically conductive layer 44. The insulating members 51 can protect the PTC material and avoid occurrence of burr or flash.

In addition to over-current protection applications, the PTC device of the present application can conduct temperature sensing. Insulating members formed at corners of the current and temperature sensing element can effectively resolve burr problems and improve sequential tape, reel and soldering processes. The PTC device is made of a laminated structure through pressing and cutting, a surface composed of laminated layers serves as a bottom surface for soldering. Not only are the simple structure and manufacturing process, but also it is suitable to be made for small devices such as form factors 0402 and 0201. In an embodiment, the PTC device has the same width and thickness to exclude the influence caused by rollover.

The above-described embodiments of the present invention are intended to be illustrative only. Numerous alternative embodiments may be devised by persons skilled in the art without departing from the scope of the following claims.

What is claimed is:

1. A PTC device, comprising:
   a current and temperature sensing element being a laminated structure of a first electrically conductive layer, a second electrically conductive layer and a PTC material layer, the first electrically conductive layer being disposed on a first surface of the PTC material layer, the second electrically conductive layer being disposed on a second surface of the PTC material layer, the second surface being opposite to the first surface;
   a first insulating layer disposed on the first electrically conductive layer;
   a second insulating layer disposed on the second electrically conductive layer;
   a first electrode layer disposed on the first insulating layer and electrically connecting to the first electrically conductive layer;
   a second electrode layer disposed on the second insulating layer and electrically connecting to the second electrically conductive layer;
   wherein corners of the current and temperature sensing element are provided with insulating members,
   wherein the first insulating layer, the first electrically conductive layer, the PTC material layer, the second electrically conductive layer and the second insulating layer form a bottom surface facing a circuit board, the first electrode layer retracts at edges relative to the first insulating layer to form notches, and the second electrode layer retracts at edges relative to the second insulating layer to form notches,
   wherein the first electrode layer comprises a bulge extending to an edge of the first insulating layer, and the second electrode layer comprises another bulge extending to an edge of the second insulating layer.

2. The PTC device of claim 1, wherein the insulating member extends over the first electrically conductive layer, the PTC material layer and the second electrically conductive layer.

3. The PTC device of claim 1, wherein the first and second electrode layers serve as solder attach surfaces for soldering the PTC device onto the circuit board.

4. The PTC device of claim 1, wherein the insulating member comprises prepreg or resin.

5. The PTC device of claim 1, wherein the insulating member has a hardness larger than that of the PTC material layer.

6. The PTC device of claim 1, wherein the insulating member has a glass transition temperature higher than that of the PTC material layer by at least 50° C.

7. The PTC device of claim 1, wherein the first electrode layer, the first insulating layer, the first electrically conductive layer, the PTC material layer, the second electrically conductive layer, the second insulating layer and the second electrode layer are laminated in order.

8. The PTC device of claim 1, wherein the first electrode layer, the first insulating layer, the first electrically conductive layer, the PTC material layer, the second electrically conductive layer, the second insulating layer and the second electrode layer form a bottom surface facing the circuit board as an interface for soldering onto the circuit board.

9. The PTC device of claim 1, further comprising:
a first electrically conductive hole penetrating through the first insulating layer and connecting to the first electrode layer and the first electrically conductive layer; and
a second electrically conductive hole penetrating through the second insulating layer and connecting to the second electrode layer and the second electrically conductive layer.

10. The PTC device of claim 9, wherein the first electrically conductive hole is located at a center or a lateral surface of the first insulating layer, and the second electrically conductive hole is located at a center or a lateral surface of the second insulating layer.

* * * * *